United States Patent

Kato et al.

[11] Patent Number: 5,688,708
[45] Date of Patent: Nov. 18, 1997

[54] METHOD OF MAKING AN ULTRA-HIGH VACUUM FIELD EMISSION DISPLAY

[75] Inventors: Yumiko Kato, Mesa; Ronald O. Petersen, Phoenix, both of Ariz.

[73] Assignee: Motorola, Schaumburg, Ill.

[21] Appl. No.: 669,204

[22] Filed: Jun. 24, 1996

[51] Int. Cl.⁶ .................................................. H01L 21/60
[52] U.S. Cl. ........................... 437/51; 437/12; 437/217; 437/228
[58] Field of Search .................................. 437/10, 12, 13, 437/51, 215, 217, 228, 916

[56] References Cited

U.S. PATENT DOCUMENTS 5,270,258  12/1993  Yoshida ........................ 437/228
5,461,009  10/1995  Huang et al. ................. 437/228
5,532,177   7/1996  Cathey ......................... 437/228
5,612,256   3/1997  Stansbury ..................... 437/217

*Primary Examiner*—Chandra Chaudhari
*Attorney, Agent, or Firm*—Eugene A. Parsons

[57] ABSTRACT

A ultra-high vacuum field emission display (100, 200) is disclosed including an anode (102, 202), a cathode (106, 206), side members (112, 212), a first non-evaporable getter material (120, 220) which is activated during the sealing and evacuation of the package, and a second getter material (122, 222) which is activated during the normal operation of the ultra-high vacuum field emission display (100, 200). The second getter material (122, 222) is activated by subsequent heating provided by radio-frequency radiation, resistive heating, or a laser.

12 Claims, 1 Drawing Sheet

METHOD OF MAKING AN ULTRA-HIGH VACUUM FIELD EMISSION DISPLAY

FIELD OF THE INVENTION

The present invention pertains to a method for providing ultra-high vacuum in a field emission display and more specifically to a method providing ultra-high vacuum in a field emission display including the use of low temperature gettering materials which are activated during the display packaging process.

BACKGROUND OF THE INVENTION

The use of gettering materials in field emission displays is to provide adequate vacuum conditions is known in the art. A field emission display includes an envelope structure having an evacuated interspace region between two display plates. Electrons travel across the interspace region from a cathode plate (also known as a cathode or back plate), upon which electron-emitter structures are fabricated, to an anode plate (also known as an anode or face plate), which includes deposits of light-emitting materials, or "phosphors". The field emission display is produced by sealing the components together, and evacuating the interspace region, at high temperatures, which are typically over 400 degrees Celsius. Constituent display components typically outgas during these elevated-temperature packaging steps. However, a high level of vacuum must be achieved and maintained inside the display to insure long display life, good uniformity of electron emission, and minimum current/brightness degradation. The electron-emitting structures of the cathode are typically made from a material such as molybdenum, tungsten or lanthanum hexaboride, and are prone to be harmfully effected by gas-induced contamination. Typically, the vacuum level within the evacuated interspace region between the cathode and anode plates must be below $10^{-5}$ Torr. In order to achieve the appropriate vacuum conditions, getter materials are included within the display envelope, or within structures in communication with the display envelope. Getter materials enhance the vacuum level by adsorption of residual, undesirable gas molecules. Several types of getter materials are available. Each type typically requires a unique temperature range for its activation to adsorb gaseous contaminants.

During the normal operation of the field emission, gaseous contaminants are produced during, for example, the impingement of the electron beams upon the phosphor deposits on the anode. The temperature within the display envelope during normal operating conditions is near ambient temperature, much less than the temperatures during the sealing steps.

Several schemes have been proposed for maintaining the high vacuum conditions required in a field emission display. In one such prior art scheme, an adequate amount of nonevaporable getter material, selected from alloys of Ta, Zr, Ti, and Hf, is disposed within an envelope created between a cathode panel and a back panel. Typically, only one type of getter is employed, the getter being activated after the sealing and evacuation processes. This subsequent activation process often includes local heating of the getter material only; the entire display is not heated, so that the deposited contaminants are not outgassed again. Thus, these prior art getters do not remove the gaseous contaminants produced during the sealing and evacuation steps of the fabrication of the display. These gaseous contaminants can deposit on active components, such as the electron-emitting structures, of the display during subsequent cooling of the display, and thereby deleterious affect their functioning.

Thus, there exists a need for a method for providing ultra-high vacuum in a field emission display while maintaining the integrity of the active components of the display.

BRIEF DESCRIPTION OF THE DRAWINGS

Referring to the drawings.

DESCRIPTION OF THE PREFERRED EMBODIMENT

Figure 1:
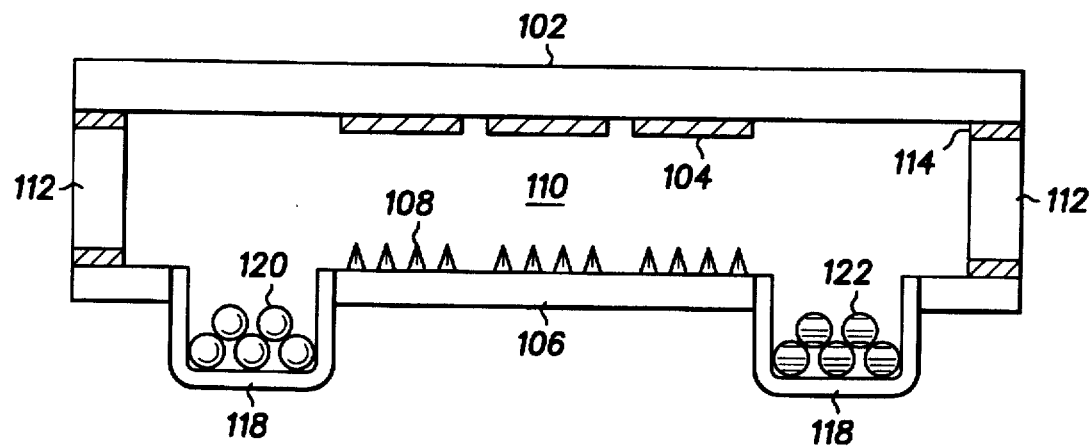
FIG. 1 is a cross-sectional view of an embodiment of an ultra-high vacuum field emission display in accordance with the present invention.

Referring now to FIG. 1, there is depicted a cross-sectional view of an ultra-high vacuum field emission display (UHV FED) 100 in accordance with the present invention. UHV FED 100 includes an anode 102 having a plurality of cathodoluminescent deposits 104, a cathode 106 including a plurality of field emitters 108, and a plurality of side members 112 which are positioned between anode 102 and cathode 106 for maintaining a predetermined spacing therebetween. The inner surfaces of anode 102 and cathode 106 and side members 112 define an interspace region 110. During the operation of UHV FED 100, electrons are extracted from field emitters 108; the electrons traverse interspace region 110, and are subsequently received by cathodoluminescent deposits 104, which are thereby caused to emit light. UHV FED 100 further includes a plurality of receptacles 118 which are in communication with interspace region 110. A portion of receptacles 118 contain a first non-evaporable getter material 120; the remainder of receptacles 118 contain a second getter material 122. First non-evaporable getter material 120 includes a material which is suitable for adsorbing gaseous contaminants during the sealing and evacuation steps during the fabrication of UHV FED 100; second getter material 122 includes a material which is suitable for adsorbing gaseous contaminants subsequent to the fabrication of UHV FED 100. A suitable material for first non-evaporable getter material 120 includes a zirconium alloy which includes a mixture of zirconium, vanadium, and iron. Such an alloy, named St172 alloy, is supplied by SAES Getters S.p.A. The St172 alloy includes a powder containing a mixture of Zr metal and a low temperature getter alloy St707 ($Zr_{70}$—$V_{24.6}$—$Fe_{5.4}$). These components are mixed and sintered to produce a very porous structure, which can be in the form of pellets. The purpose of the mixture is to allow sintering at low temperature and to provide the high porosity/surface area required for a non-evaporable getter. Other suitable materials for first non-evaporable getter material 120 include similar mixtures wherein a metal, such as Zr, Ti, Al, Ni or Co, is mixed and sintered with a suitable low temperature getter alloy. While the metal constituent is also capable of gettering gases, the primary purpose of its inclusion is to facilitate the binding together of the particles of the low temperature getter alloy to provide a porous structure, or to bind the low temperature getter alloy to some other metallic substrate, such as nickel or a nickel alloy. The porosity of this sintered structure ensures a high surface area to provide long life. Another suitable material for first non-evaporable getter material 120, includes a mixture of Ti metal and St101 ($Zr_{84}$—$Al_{16}$), which is a low temperature getter alloy supplied by SAES Getters S.p.A. The Ti metal acts as a binder for the particles comprising the St101 low temperature getter alloy. This type of getter is commonly referred to as a non-evaporable getter. The low temperature getter alloy component of the mixture is capable of chemically diffusing surface contaminants into the bulk alloy powder at low temperatures, such as the temperatures typical of the frit sealing process. During the sealing step in the fabrication of UHV FED 100, outgassing of display components produces gaseous species which are received by the surface of the low temperature getter alloy component of first non-evaporable getter material 120, thereby contaminating the surface. Then, the adsorbed contaminants diffuse from the surface into the bulk of the particle, thereby activating/rejuvenating the surface and restoring its gettering capability. The surface continues to getter as long as the bulk of the particle is not saturated with contaminates. This activation/rejuvenation process is accomplished through heating to a low temperature, such as the sealing temperature. While this activation process actually begins at temperatures as low as 200° C., the rate of diffusion only becomes appreciable at temperatures above about 300° C. A suitable material for second getter material 122 includes a transition metal such as tantalum, zirconium, titanium, or hafnium, which is typically provided as a pellet, powder, or coating. An example includes St171 zirconium getter material also supplied by SAES Getters S.p.A. In order to activate/rejuvenate second getter material 122, it must be heated to a temperature that is high enough to effect diffusion of surface contaminants into the bulk, thereby restoring a clean surface that can react with the contamination gases. For the transition metals listed above, this temperature is typically near 900° C., which is achieved by selectively heating second getter material 122, which is described in greater detail below. Another suitable material for second getter material 122 includes flashable titanium or flashable barium. In contrast to non-evaporable getters, flashable getters are used to coat the inner surfaces of UHV FED 100 with a thin film of the gettering metal. Titanium and barium are gettering materials which readily absorb gases. A suitable flashable getter includes $BaAl_4$, which may be applied as a coating to the inner surfaces of receptacle 118. After the sealing and evacuation steps are completed, second getter material 122, including the $BaAl_4$, is selectively heated, using a method such as electrical/resistive heating or inductive heating, thereby causing the Ba to vaporize and be released into the display. This free, gaseous barium deposits to form a thin, gettering layer within UHV FED 100. Resistive heating can be achieved by applying a coating of second getter material 122 to a resistive heating element, such as a resistive wire, to which an external voltage source can be applied. Whenever it is desired to activate second getter material 122, a voltage is applied over the resistive heating element to produce an electrical current, thereby generating heat from the wire which raises the temperature of the coating. Like the sintered, non-evaporable getters, the barium getter action is dependent on the surface area. In a field emission display, the flashable getter requires larger space to provide the same gettering action of a non-evaporable getter. Second getter material 122 must be capable of reactivation by heating subsequent to the sealing process; it need not be active during the sealing process. Adequate heating to provide the activation temperature for second getter material 122 can also be achieved by methods such as applying radio-frequency radiation to second getter material 122, or by heating it with a laser. The particular temperature at which a getter material is activated to adsorb/remove contaminants, the activation temperature, depends upon the identity of the getter material. The activation temperature of first non-evaporable getter material 120 is provided during the sealing and evacuation steps during the fabrication of UHV FED 100. UHV FED 100 must include hermetic seals between side members 112 and anode 102 and cathode 106. In this particular embodiment, this is done by using glass frit sealant. The package—comprised of side members 112, anode 102, cathode 106, first non-evaporable getter material 120, and second getter material 122—is then placed in an oven in order to cure the frit sealant to provide the hermetic seals. The temperature, the sealing temperature, at which the frit is cured depends on the identity of the frit, and is typically within a range of about 400–550 degrees Celsius. During this heating of the package, gaseous contaminants are outgassed from the frit sealant and the components of the package. If these gaseous contaminants are not removed during the sealing and evacuation steps during the fabrication of UHV FED 100, they deposit on internal surfaces of UHV FED 100 during subsequent cooling of UHV FED 100. The gaseous contaminants produced during packaging can thereby be deposited on active components of UHV FED 100, such as field emitters 108, thereby potentially interfering with their optimal functioning. Subsequent to the packaging process, UHV FED 100 is not subjected to temperatures high enough to desorb these gaseous contaminants which are produced during the packaging steps. The heating of second getter material 122 is selective, by localizing an external energy source at second getter material 122, so that entire UHV FED 100 is not heated. The typically high activation temperatures of materials suitable for use for second getter material 122 would have a deleterious effect upon other components of UHV FED 100, such as cathodoluminescent deposits 104, were these components subjected to such elevated temperatures. To insure proper functioning of the active components of UHV FED 100, it is necessary to remove the gaseous contaminants produced during the sealing and evacuation steps, before they are adsorbed by the inner surfaces of UHV FED 100. First non-evaporable getter material 120 is selected so that its activation temperature is equal to the sealing temperature of UHV FED 100. This temperature is also maintained during the evacuation of interspace region 110 to maintain the gettering action of first non-evaporable getter material 120. In this particular embodiment, the evacuation of interspace region 110 occurs concurrent with the sealing step by performing the sealing step in a vacuum oven. In other embodiments of the present invention, the sealing is performed first in, for example, an argon atmosphere, and an opening is left in the package. The package is thereafter evacuated by pumping out the interspace region through the opening by using a vacuum pump. Then, after a predetermined vacuum has been achieved, the opening is sealed shut. A suitable vacuum is less than $10^{-5}$ Torr, preferably less than $10^{-6}$ Torr. After UHV FED 100 has been sealed and evacuated, the vacuum within interspace region 110 can be further improved by activating second getter material 122. This can be done shortly after completely sealing the package and/or at some time after normal operation of UHV FED 100 has commenced. Outgassing occurs during the normal operation of UHV FED 100 when emitted electrons are received by cathodoluminescent deposits 104. To return the vacuum to a suitable level, second getter material 122 is activated by selective heating of second getter material 122 using a suitable activator, such as radio-frequency radiation, resistive heating, or a laser, to achieve the activation temperature of second getter material 122. The contaminant, gaseous species produced during the electron desorption of cathodoluminescent deposits 104 are thereby adsorbed by second getter material 122, thereby maintaining a predetermined vacuum level within UHV FED 100 and mitigating degradation of field emitters 108. In other embodiments of the present invention, a single low temperature getter material is used which is activated at the sealing and evacuation temperatures and which can also be selectively activated by an external energy source subsequent to the sealing and evacuation of the display. This single low temperature getter material has an activation temperature equal to the sealing and evacuation temperature so that it provides gettering action during the sealing and evacuation steps. Subsequent to the packaging process, it can be selectively heated to its activation temperature by the external energy source whenever it is desired to improve the vacuum conditions within the display.

Figure 2:
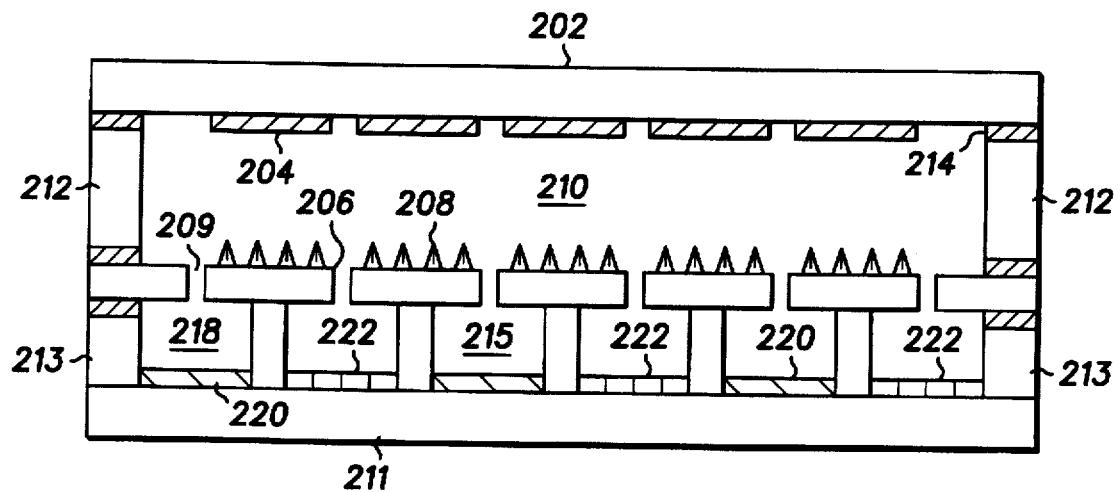
FIG. 2 is a cross-sectional view of another embodiment of an ultra-high vacuum field emission display in accordance with the present invention.

Referring now to FIG. 2, there is depicted a cross-sectional view of an ultra-high vacuum field emission display (UHV FED) 200 in accordance with the present invention. UHV FED 200 includes an anode 202 having a plurality of cathodoluminescent deposits 204, a cathode 206 including a plurality of field emitters 208, and a backplate 211 which is spaced from the cathode. UHV FED 200 further includes a first plurality of side members 212 which are positioned between anode 202 and cathode 206 for maintaining a predetermined spacing therebetween, and a second plurality of side members 213 which are positioned between cathode 206 and backplate 211. Anode 202, cathode 206, and side members 212 define an interspace region 210; cathode 206, backplate 211, and side members 213 define a plenum 215. Cathode 206 includes a plurality of holes 209 which communicate with both interspace region 210 and plenum 215 so that gaseous contaminant can travel from interspace region 210 to plenum 215. Disposed within plenum 215 is a first getter material 220 and a second getter material 222, which have the same properties as first non-evaporable getter material 120 and second getter material 122, respectively, as described with reference to FIG. 1. During the operation of UHV FED 200, electrons are extracted from field emitters 208; the electrons traverse interspace region 210, and are subsequently received by cathodoluminescent deposits 204, which are thereby caused to emit light. During the sealing and evacuation steps of the fabrication of UHV FED 200, gaseous contaminants, that are outgassed within interspace region 210, travel through holes 209 and are adsorbed by first getter material 220, thereby precluding the deposition/condensation, onto other components of UHV FED 200, of these gaseous contaminants during subsequent cooling of the package. Subsequent to the sealing and evacuation steps, additional gaseous contaminants are outgassed when electrons are received by cathodoluminescent deposits 204. These additional gaseous contaminants travel through holes 209 in cathode 206 and are received by second getter material 222, which is heated to its activation temperature in a manner similar to the heating of second getter material 122 described with reference to FIG. 1. Second getter material 222 adsorbs these additional gaseous contaminants, thereby maintaining the predetermined vacuum level within interspace region 210.

While we have shown and described specific embodiments of the present invention, further modifications and improvements will occur to those skilled in the art. We desire it to be understood, therefore, that this invention is not limited to the particular forms shown, and we intend in the appended claims to cover all modifications that do not depart from the spirit and scope of this invention.

What is claimed is:

1. A method for fabricating an ultra-high vacuum field emission display, the method including the steps of:

providing a cathode;

providing an anode;

providing a plurality of side members;

affixing the side members to the cathode and the anode so that the cathode, the anode, and the side members define an interspace region and provide a package;

providing a first non-evaporable getter material in communication with the interspace region, the first non-evaporable getter material having an activation temperature;

providing within the interspace region a vacuum having a value less than $10^{-5}$ Torr; and concurrent with the steps of affixing the side members and providing a vacuum, activating the first non-evaporable getter material thereby removing gaseous species outgassed during the steps of affixing the side members and providing a vacuum.

2. A method for fabricating an ultra-high vacuum field emission display as claimed in claim 1 further including subsequent to the steps of affixing the side members and providing a vacuum the step of selectively heating the first non-evaporable getter material to the activation temperature of the first non-evaporable getter material thereby providing gettering action.

3. A method for fabricating an ultra-high vacuum field emission display as claimed in claim 2 wherein the step of selectively heating the first non-evaporable getter material includes operably coupling an external energy source to the first non-evaporable getter material.

4. A method for fabricating an ultra-high vacuum field emission display as claimed in claim 3 wherein the external energy source is selected from a group consisting of a radio-frequency radiation generator, a laser, and a voltage source.

5. A method for fabricating an ultra-high vacuum field emission display as claimed in claim 1 further including the steps of providing a second getter material being in communication with the interspace region and having an activation temperature and, subsequent to the steps of affixing the side members and providing a vacuum, activating the second getter material thereby removing gaseous species outgassed during the operation of the ultra-high vacuum field emission display so that a vacuum below $10^{-5}$ Torr is maintained within the interspace region.

6. A method for fabricating an ultra-high vacuum field emission display as claimed in claim 5 wherein the step of activating the second getter material includes the steps of operably coupling the second getter material to an external energy source and selectively heating the second getter material with the energy source to the activation temperature of the second getter material.

7. A method for fabricating an ultra-high vacuum field emission display as claimed in claim 6 wherein the external energy source includes radio-frequency radiation generator.

8. A method for fabricating an ultra-high vacuum field emission display as claimed in claim 6 wherein the external energy source includes a laser.

9. A method for fabricating an ultra-high vacuum field emission display as claimed in claim 6 wherein the external energy source includes a voltage source.

10. A method for fabricating an ultra-high vacuum field emission display as claimed in claim 1 wherein the step of affixing the side members includes heating the package in an oven at a sealing temperature, the activation temperature of the first non-evaporable getter material being equal to the sealing temperature.

11. A method for fabricating an ultra-high vacuum field emission display as claimed in claim 1 wherein the step of providing a vacuum includes performing the step of affixing the side members within a vacuum chamber.

12. A method for fabricating an ultra-high vacuum field emission display as claimed in claim 1 wherein the step of providing a vacuum includes the step of evacuating the interspace region subsequent to the step of affixing the side members by using a vacuum pump.

* * * * *